United States Patent
Chen et al.

(10) Patent No.: US 11,597,646 B2
(45) Date of Patent: *Mar. 7, 2023

(54) MICROFLUIDIC DEVICE WITH MANIFOLD

(71) Applicant: HEWLETT-PACKARD DEVELOPMENT COMPANY, L.P., Houston, TX (US)

(72) Inventors: Chien-Hua Chen, Corvallis, OR (US); Devin Alexander Mourey, Corvallis, OR (US); Michael W. Cumbie, Corvallis, OR (US); Si-lam Choy, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 109 days.

This patent is subject to a terminal disclaimer.

(21) Appl. No.: 16/098,991

(22) PCT Filed: Jul. 26, 2016

(86) PCT No.: PCT/US2016/044051
§ 371 (c)(1),
(2) Date: Nov. 5, 2018

(87) PCT Pub. No.: WO2018/022014
PCT Pub. Date: Feb. 1, 2018

(65) Prior Publication Data
US 2019/0144268 A1    May 16, 2019

(51) Int. Cl.
*B81B 7/00* (2006.01)
*B01L 3/00* (2006.01)

(52) U.S. Cl.
CPC ...... *B81B 7/0061* (2013.01); *B01L 3/502707* (2013.01); *B01L 3/502715* (2013.01);
(Continued)

(58) Field of Classification Search
CPC ......... B01L 2200/12; B01L 2300/0887; B01L 2300/0816; B01L 3/502715;
(Continued)

(56) References Cited

U.S. PATENT DOCUMENTS 6,209,928 B1    4/2001 Benett et al.
6,772,513 B1 *  8/2004 Frye-Mason ..... B01L 3/502715
                                                137/597
(Continued)

FOREIGN PATENT DOCUMENTS

CN    101808826 A    8/2010
JP    2007525667     9/2007
(Continued)

OTHER PUBLICATIONS

Fredrickson, C.K.; "Macro-to-Micro Interfaces for Microfluidic Devices"; Research Paper; Nov. 10, 2004.
(Continued)

*Primary Examiner* — Rebecca M Fritchman
(74) *Attorney, Agent, or Firm* — Foley & Lardner LLP

(57) ABSTRACT

A device includes: a die including a microfluidic device; a polymer substrate formed around the die; and a separate fluid manifold attached to the polymer substrate over the die and on a same side of the substrate as the die, the manifold to deliver fluid to the die.

20 Claims, 9 Drawing Sheets

(52) U.S. Cl.
CPC ... *B01L 2200/12* (2013.01); *B01L 2300/0816* (2013.01); *B01L 2300/0887* (2013.01); *B81B 2201/0214* (2013.01); *B81B 2201/0292* (2013.01); *B81B 2201/058* (2013.01)

(58) Field of Classification Search
CPC ......... B01L 3/502707; B81B 2201/058; B81B 2201/0292; B81B 7/0061; B81B 2201/0214
See application file for complete search history.

(56) References Cited

U.S. PATENT DOCUMENTS

| | | | |
|---|---|---|---|
| 6,821,819 | B1 | 11/2004 | Benavides et al. |
| 7,267,431 | B2 | 9/2007 | Anderson et al. |
| 8,382,253 | B1* | 2/2013 | Rivas ............... B41J 2/1601 |
| | | | 347/56 |
| 2002/0064841 | A1 | 5/2002 | Klemic et al. |
| 2006/0001704 | A1* | 1/2006 | Anderson ............ B41J 2/17513 |
| | | | 347/65 |
| 2007/0027200 | A1 | 11/2007 | Kahl |
| 2007/0272000 | A1* | 11/2007 | Kahl ................. B01L 3/502753 |
| | | | 73/53.01 |
| 2008/0311000 | A1 | 12/2008 | Wimberger-Friedl |
| 2009/0079783 | A1 | 3/2009 | Mehta et al. |
| 2011/0155586 | A1* | 6/2011 | Elibol ................ G01N 27/3278 |
| | | | 205/777.5 |
| 2011/0300034 | A1 | 12/2011 | Mair |
| 2012/0141329 | A1 | 6/2012 | Yamakawa |
| 2014/0199764 | A1 | 7/2014 | Domansky et al. |
| 2015/0061189 | A1 | 3/2015 | Reiter |
| 2015/0198380 | A1* | 7/2015 | Haj-Hariri ............ F01D 5/187 |
| | | | 62/3.2 |
| 2016/0001284 | A1 | 1/2016 | Rida et al. |

FOREIGN PATENT DOCUMENTS

| | | |
|---|---|---|
| JP | 2008511825 | 4/2008 |
| JP | 2010173017 | 8/2010 |
| TW | I247884 | 8/2004 |
| TW | 200413097 | 10/2004 |
| WO | WO-2013158860 A1 | 10/2013 |

OTHER PUBLICATIONS

Webb, D.P.; "Packaging of Microfluidic Devices for Fluid Interconnection Using Thermoplastics"; Research Paper; Feb. 27, 2009.

* cited by examiner

MICROFLUIDIC DEVICE WITH MANIFOLD

BACKGROUND

Microfluidic devices are increasingly used to measure parameters from a fluid sample. Decreasing cost per test and the ability to use relatively small sample volumes are two of the factors that are driving interest in microfluidic devices.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
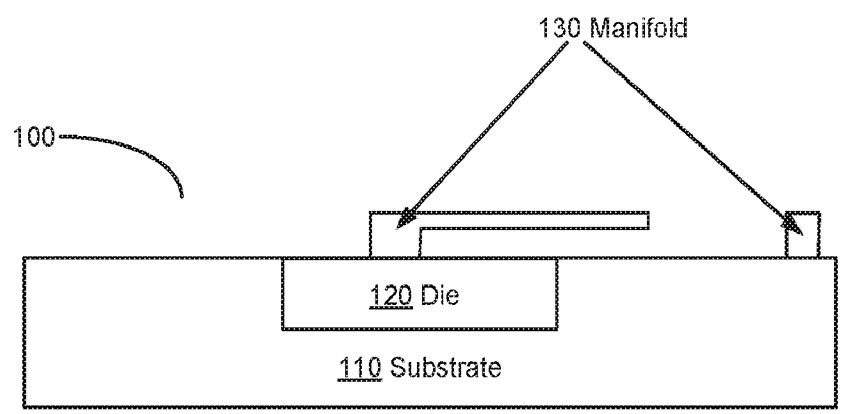
FIG. 1 is a cross-sectional diagram of a device, consistent with the disclosed implementations.

The area of microfluidic devices uses techniques developed in the manufacturing of electronic devices and applies them to devices that handle electricity and fluids. Microfluidic devices may include microelectromechanical systems (MEMS) and/or electronic components in addition to fluid handling and/or testing components.

One challenge as microfluidic components have continued to get smaller is providing fluid and electrical connections to the microfluidic devices. Even syringes and similar devices are relatively large compared with the micron-scale components available with microfluidic devices. Further, the fluid provided to be tested should be representative of the sample. Accordingly, trapped bubbles and similar issues can be challenges when developing micron-scale devices.

One solution is to use an interface to transition fluids between a millimeter-scale and micron-scale. Such an interface may be integrated into a silicon die. This results in a die that is larger than otherwise needed due to the size of the fluid connections for the user. The cost of a silicon die increases rapidly and non-linearly with size due to the potential for die defects in the wafer processing processes. Accordingly, silicon die that incorporate fluid routing and distribution that is compatible with larger scale interaction (such as direct user interaction) tend to be more expensive due to the increased size of the silicon die. While substrates of other materials may be used for forming microelectronic, microfluidic, and MEMS components, silicon continues to offer a wide range of processes and properties that make silicon substrates attractive and widely used. Other substrates have similar but less pronounced costs associated with larger die.

Another approach is to mount a die in packaging. The packaging may include a number of recesses that each receives a die. This may allow the use of smaller die, e.g., without the integrated fluid handling components. These smaller die may cost less than larger die. This approach still includes additional work to provide fluids to the die. One limitation is the interface between the die on the packaging and the surrounding surface of the packaging. If fluid is allowed to contact non-surface layers of the die, the fluid may interact with electrical connections or short elements of the die, producing erratic response or incorrect performance. Such connections can also serve as leaks which may divert fluid intended for measurement or other purposes.

Consequently, this specification discloses another approach to providing fluidic routing to a die. The die is molded into a composite structure. This allows the die to be in direct contact with the surrounding substrate and avoid gaps between the substrate and die. The die may or may not include fluidic routing features on an upper surface. In one example, the die includes a patterned polymer layer on the upper surface of the die. A manifold is then attached over the die molded onto the substrate. Molding the die into the substrate avoids gaps and/or discontinuities between the die and the substrate that make providing fluid to the die from the substrate or off the die more difficult.

According to one example, a device includes: a die including a microfluidic device; a polymer substrate formed around the die; and a separate fluid manifold attached to the polymer substrate over the die and on a same side of the substrate as the die, the manifold to deliver fluid to the die.

In another example, a method of forming a device, the method includes: forming a microfluidic device in a semiconductor die; forming a polymer substrate around the die; and attaching a separate manifold to the substrate over the die, the manifold providing channels for conducting fluid to the microfluidic device of the die.

In another example, a device includes: a die comprising a microfluidic device; a polymer substrate formed around the die without any gap between the substrate and the die, wherein a top surface of the die is coplanar with a top surface of the polymer substrate; and a separate fluid manifold, formed of plastic and attached to the polymer substrate, the manifold comprising fluid channels to deliver fluid to the microfluidic device of the die.

As used in the present specification and in the appended claims, the term "millimeter-scale" is meant to be understood broadly as encompassing fluid handling features where all dimensions contacted by the fluid are greater than 100 micrometers and less than 100 millimeters.

As used in the present specification and in the appended claims, the term "micron-scale" is meant to be understood broadly as encompassing fluid handing features with at least one dimension less than 1000 micrometers and greater than 100 nanometers. For example, a pair of plates separated by 100 micrometers with a width of 10 millimeters would qualify as a micron-scale fluidic component because the pair of plates has at least one dimension within the recited range.

As used in the present specification and in the appended claims, the term "fluidic interface" is meant to be understood broadly as a collection of fluid distribution components to move fluid from a fluidic entry location to the microfluidic device on a die.

Turning now to the figures, FIG. 1 is a cross-sectional diagram of a device (100), consistent with the disclosed implementations. FIG. 1 shows a device (100) that includes: a die (120) including a microfluidic device; a polymer substrate (110) formed around the die; and a separate fluid manifold (130) attached to the polymer substrate (110) over the die (120) and on a same side of the substrate (110) as the die (120), the manifold (130) to deliver fluid to the die (120).

The die (120) includes a microfluidic device and the fluidic and electrical routing to make that microfluidic device and its components function. With respect to the substrate (110) just the upper surface of the die in FIG. 1 is fully exposed. This exposed surface of the die receives fluid delivered by the manifold.

Microfluidic devices include a wide variety of functions and purposes. A few representative examples of microfluidic devices include: enzymatic sensors, pH sensors, conductivity sensors, fluid pumps, protein sensors, liquid absorbance, transmission, and reflection sensors, protein separators, cell topography detectors, and cell counting systems.

The substrate (110) is formed around the die (120). The substrate (110) provides support for the die (120) as well as providing area beyond the die (120) for the manifold (130) to interact with. The substrate (110) provides a smooth transition to the die (120). There is not a gap between the die (120) and the substrate (110).

In one example, the substrate (110) and the die (120) form a coplanar top surface. However, the die may be recessed or proud with respect to the substrate surface. A flat seam between the substrate (110) and the die (120) facilitates forming fluidic channels across the seam using the manifold (130). This allows the manifold (130) between the seam and the channel to avoid leakage. Accordingly, attached portions of the manifold (130) may extend across the seam without loss of fluid.

The substrate (110) may be a polymer. The substrate may be a composite. The substrate may be heterogeneous or homogenous. The substrate may be a thermoplastic, for example, polyethylene (PE, HDPE, LDPE), polypropylene (PP), polycarbonate (PC), polyimide, polyether ether ketone (PEEK), polystyrene (PS), polyamide, etc. The substrate may be a thermoset polymer, for example, epoxy, polyurethane, or polyesters. Other suitable polymers may be appropriate depending on the desired transmissivity, mechanical strength, and cost parameters for the device (100).

The die (120) may be a single die (120) or multiple die. The die (120) may be formed of a semiconductor, for example, silicon. The die (120) may be formed on non-semiconductors, for example, polymer, glass, etc.

The word die is used in this specification and the associated claims as both the singular and plural. Other plurals, dice and dies, are also recognized in the art. Unless accompanied by a modifier that defines the number of die, for example, multiple, single, or plural, the term die should be understood as referring to a single die and allowing multiple die. For example, most of the figures show a die but also allow the use of multiple die.

As indicated, the substrate (110) may be formed around multiple die. The different die (120) may be formed using the same or different processes. The different die (120) may have the same or different thicknesses. The ability to mix and match the die (120) with their associated materials and processes provides flexibility in design and implementation of the device (100). For example, positive and negative pull down networks can be readily integrated into a common design without additional die (120) process layers. The die (120) can be functionally evaluated prior to forming the substrate (110) to limit fallout.

The manifold (130) provides an interface between millimeter-scale and micron-scale fluidic components. Providing the small volumes of fluid used by microfluidic devices without bubbles which may interfere with the function of the microfluidic device may be a challenge in some designs. Handling and dispensing sub-milliliter volumes of fluid can similarly be challenging. In one example, the manifold receives fluid in larger volumes or through larger features, such as an inlet port. The inlet port may be a metal and/or ceramic component integrated into the manifold (130). The inlet port may be a polymer portion of the manifold (130).

In one example, the manifold (130) is a monolithic component. The manifold may be molded, cast, and/or thermoformed. The manifold (130) may be a molded component. For example, the manifold (130) may be transfer molded. The manifold (130) may be injection molded. Injection molding provides relative advantages in per part cost and reduced part to part variation. The manifold (130) may be a cast component. Casting, for example, using epoxy, is a cost effective method to produce prototype parts and test designs before committing to molds. In one example, a three dimensional printed part is used to form a negative silicone mold. The silicone mold is then used to produce cast parts. This approach offers the ability to rapidly and cheaply form and test designs.

The manifold (130) may be formed by thermoforming. Thermoforming offers the ability to reshape thermoplastic parts into a finalized shape. While the depth of thermoformed parts is generally thinner than can be achieve with molding, in designs such as the manifold (130), which has a relatively small dimensions, thermoforming may provide a faster response and simpler mold design compared with injection molding. While the variety of material options in thermoforming is less broad than with injection molding, suitable mechanical and surface properties are generally achievable with reduced capital costs and turnaround time compared with injection molding.

The manifold (130) may be a laminate structure. The manifold (130) may be formed from layers of material laminated together with adhesive. In one example, the material is a polymer sheet. The use of polymer sheets as the laminate material allows rapid and cost effective cutting, punching, or laser cutting. The adhesive may be applied before cutting or after cutting. The adhesive may be applied to the substrate and the cut sheet applied over the adhesive. The manifold (130) may include alignment features to facilitate alignment, for example, alignment pins, windows, guides, rulers, etc. The laminate manifold (130) may be assembled and then applied to the substrate (110). The laminate manifold (130) may be assembled on the substrate (110).

The manifold (130) may include additional active elements or components. For example, the manifold (130) may include lenses, windows, electrodes, conductors, filters, etc. These active elements may add to the functionality, assist the operation of the components on the die (120), and/or add additional capabilities to the device (100). The inclusion of active elements in the manifold may reduce the number of process operations in the die (120) production operation. This can have the advantage of reducing the cost of the final device (100). The ability to separate the production of the die (120) and the manifold (130) may provide opportunities for scrap reduction and/or cost reduction. This may be due to the ability to identify defective components prior to integration into the device (100).

The manifold (130) may include a reservoir. The reservoir may serve to hold fluid. The reservoir may contain solid material that is dissolved into provided fluid. In the manifold (130) may use a variety of different channel dimensions to prepare and distribute fluid to the die (120).

Figure 2:
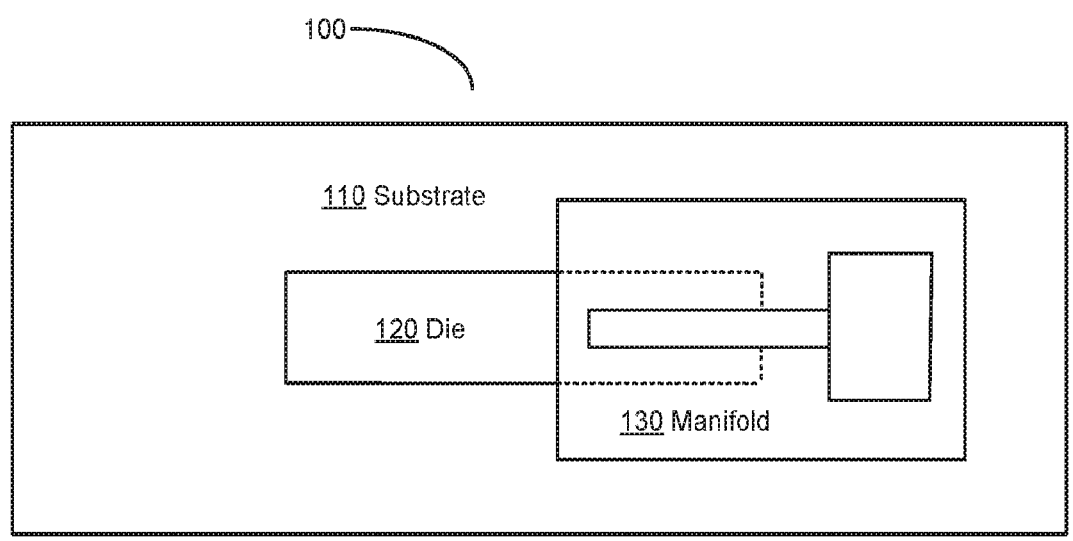
FIG. 2 is a top view of a device, consistent with the disclosed implementations.

FIG. 2 is a top view of a device (100), consistent with the disclosed implementations. The device (100) shows a substrate (110) with a die (120). A manifold (130) is on top of both the die (120) and the substrate (110). An edge of the manifold (120) crosses the transition between the die (120) and the substrate (110).

Similarly, a fluid path in the manifold (130) crosses the transition (dotted line) between the die (120) and the substrate (110). In other words, in the example of FIG. 2, at least a portion of the manifold is attached to the substrate away from the die such that a fluid pathway from the manifold to the die includes a portion of a top surface of the substrate as part of a fluidic interface between the manifold and die.

Figure 3:
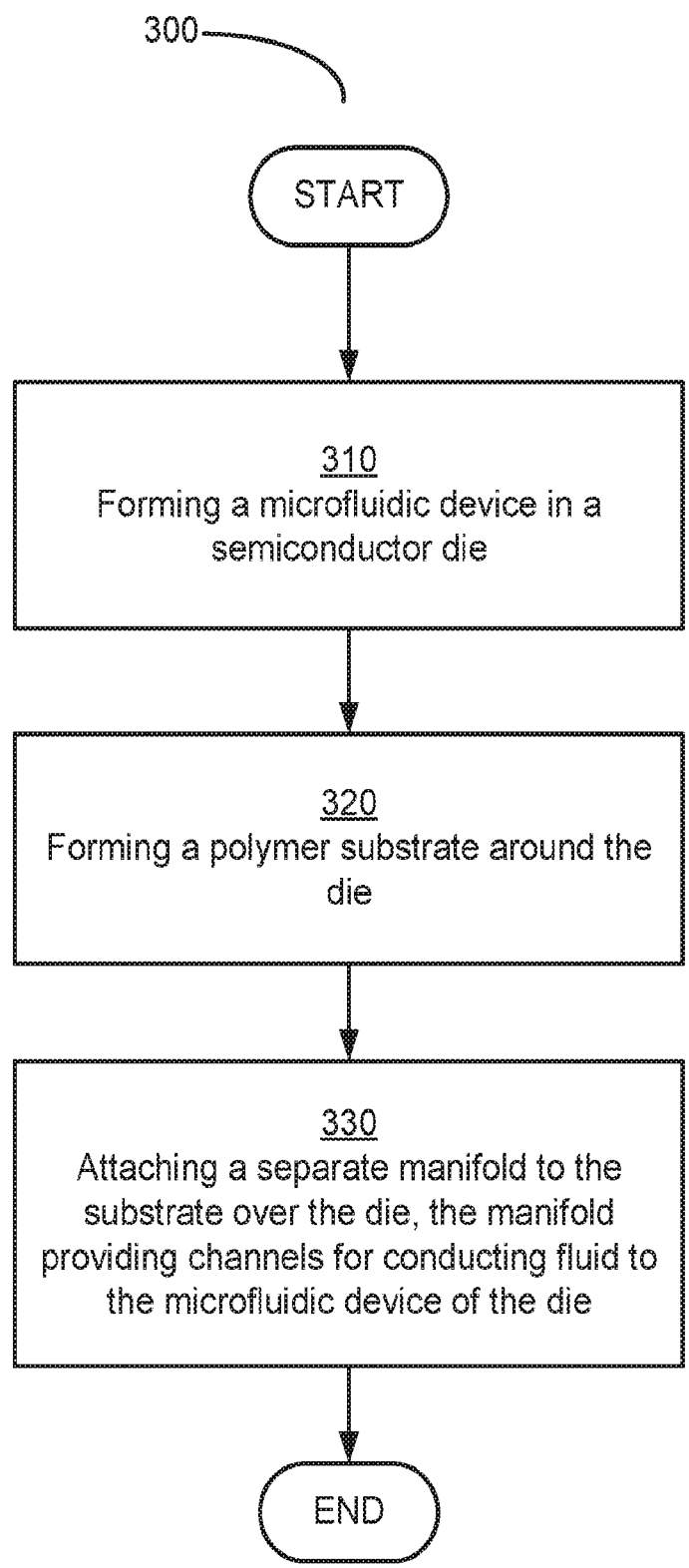
FIG. 3 is a flowchart showing a method consistent with the disclosed implementations.

FIG. 3 is a flowchart showing a method (300) consistent with the disclosed implementations. The method includes: forming (310) a microfluidic device in a semiconductor die (120); forming (320) a polymer substrate (110) around the die (120); and attaching (330) a separate manifold (130) to the substrate (110) over the die (120), the manifold (130) providing channels for conducting fluid to the microfluidic device of the die (120).

The method (300) includes forming (310) a microfluidic device in a semiconductor die (120). The die (120) may include a plurality of microfluidic devices. The die (120) may include fluid handling components and/or sensors. The die (120) may include multiple microfluidic components. The die (120) may include electronic components or microelectromechanical components.

The method (300) includes forming (320) a polymer substrate (110) around the die (120). This approach allows the die (120) and the substrate (110) to be in direct contact without a gap between them. Accordingly, when a manifold (130) is placed across the interface between the die (120) and the substrate (110) it is possible to do so without creating a leak.

The method (300) includes attaching (330) as separate manifold (130) to the substrate (110) over the die (120), the manifold (130) providing channels for conducting fluid to the microfluidic device of the die (120). In one example, the manifold (130) includes a channel on the face that is placed over the die (120) and the substrate (110). Fluid may be provided to the channel over the substrate (110) and then flow in the channel from the substrate (110) to the die (120). The fluid may be contained by walls of the channel formed in the manifold (130). One advantage of this type of channel is that the molds used to form an exposed channel in the surface of the manifold are simpler than molds used to form internal channels in the manifold (130). Internal channels may include insert pins, multiple shots, or a multilayer manifold assembly (130) in order to provide the desired distribution. Using simpler molds may reduce prototyping time as well as manufacturing costs. Using the die (120) and substrate (110) surfaces to provide a wall of the channel and contain the fluid as the fluid transits to the device in the die (120) may help simplify manifold design.

Figure 4:
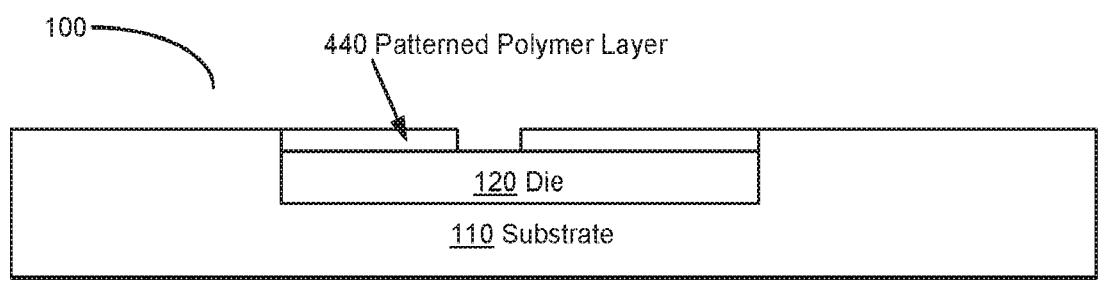
FIG. 4 is a cross-sectional diagram of a device, consistent with the disclosed implementations.

FIG. 4 is a cross-sectional diagram of a device (100), consistent with the disclosed implementations. In this example, the die includes micron-scale fluid passageways on a top surface thereof adjacent to the manifold and formed over thin film circuitry, the fluid passageways to communicate fluid from the manifold to components of the microfluidic device. As shown in FIG. 4, the device includes a die (120) in a substrate (110). The die (120) has a patterned polymer layer (440) over a portion of the top surface of the die (120) just above thin film circuitry. The patterned polymer layer (440) is used to facilitate fluidic routing between the die (120) and the manifold (130). The patterned polymer layer (440) may be a plurality of layers.

In one example, the patterned polymer layer (440) is a layer of radiation sensitive or photo-sensitive material, such as a polymer, that is lithographically-patterned. In one example, the patterned polymer layer (440) is SU-8. The radiation sensitive polymer may be a positive or negative sensitive layer. Radiation exposure, for example ultraviolet light, may either cross link and/or otherwise render difficult to remove, exposed or unexposed portions of the radiation sensitive polymer layer.

After patterning the photosensitive polymer layer, portions of the layer may be removed by chemical, mechanical, plasma, and/or other methods to produce a pattern of polymer on an upper surface of the die (120). The pattern may include microfluidic features or fluid handling elements. For example, the pattern may include channels to direct fluid to portions of the die (120). The patter may include a standardized interface to interact with a common manifold (130) design. The pattered polymer layer (440) may include alignment features. A single manifold design (130) may be used with a variety of different die (120) designs. In another example, a variety of manifold (130) designs are used with a common die (120) design to produce a variety of devices (120). The ability to customize the final device by mixing die (120) and manifolds (130) may reduce the number of inventory parts with their associated cost.

In one example, the patterned polymer layer (440) is coextensive with the footprint of the die (120). In one example patterned polymer layer (440) covers less than all of the top surface of the die (120). This may allow direct flow between the manifold (130) and the die (120). In a third example, the patterned polymer layer (440) extends beyond the footprint of the die (120) over a portion of the substrate (110). For example, the die (120) may be overmolded by the substrate (110), the die (120)-substrate (110) assembly may then have a patterned polymer layer (440) formed over the assembly.

Figure 5A:
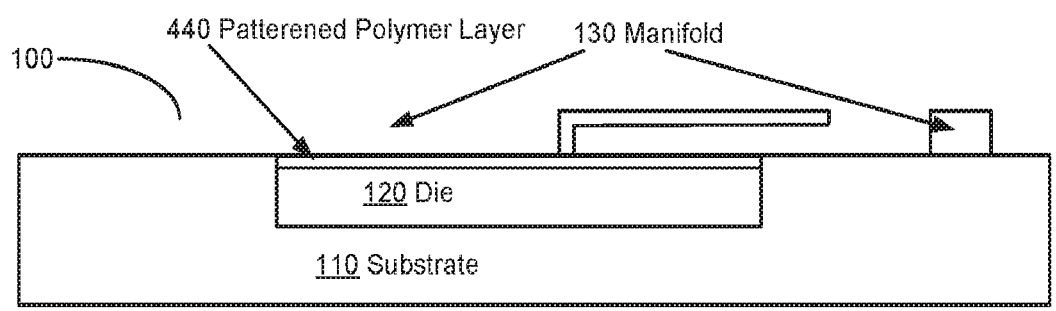
FIGS. 5A and 5B are a cross-sectional diagram and a top view of a device, consistent with the disclosed implementations.
Figure 5B:
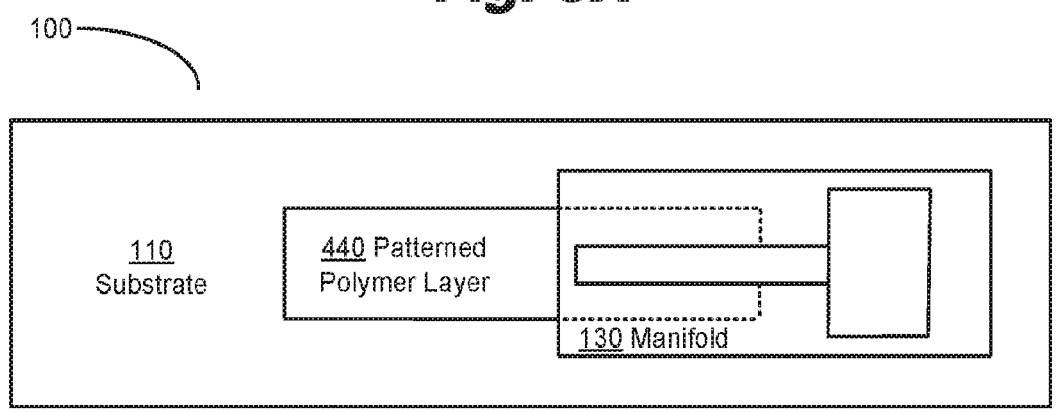

FIGS. 5A and 5B are a cross-sectional diagram and a top view of a device, consistent with the disclosed implementations. FIGS. 5A and 5B show a device (100) with a die (120). The die is surrounded by a substrate (110). A portion of the upper surface of the die (120) is covered by a patterned polymer layer (440). In one example, the patterned polymer layer (440) covers all of an upper surface of the die (120). A manifold (130) covers a portion of the patterned polymer layer (440) and a portion of the substrate (110). In one example, the patterned polymer layer (440) extends beyond the footprint of the die (120) and over a portion of the substrate (110). An edge of the manifold crosses the interface between the patterned polymer layer (440) and the substrate (110). An edge of a channel in the manifold (130) crosses an interface between the patterned polymer layer (440) and the substrate (110).

The manifold (130) may include a port on the top or side of the manifold for receiving fluid. The port may be metal. The port may be ceramic. The port may be polymer. The port may include a tube. The manifold (130) may include a metal, plastic, and/or ceramic tube. The port may include a luer or similar fitting. The manifold may include a port that connects to the patterned polymer layer (440) to provide fluid to the die (120) through the microfluidic layer (120). The manifold (130) includes a channel in the face of the manifold which contacts the substrate (110) and the patterned polymer layer (440). The transition between the die (120) and the substrate (110) should be smooth and continuous such that fluid passing through the channel is contained and does not leak.

In one example, the smooth, gap-free interface between the die (120) and the substrate (110) is a result of forming the substrate (110) around the die (120). This avoids a gap or having to engage in a secondary gap filling operation between the substrate (110) and the die (120). In one example, the gap-free interface between the substrate (110) and the die (120) is achieved by casting the die (120) in the substrate (110). In another example, the gap-free interface is achieved by overmolding the substrate (110) around the die (120). In a third example, the gap-free interface between the die (120) and the substrate (110) is produced by compression molding the substrate (110) around the die (120).

Figure 6:
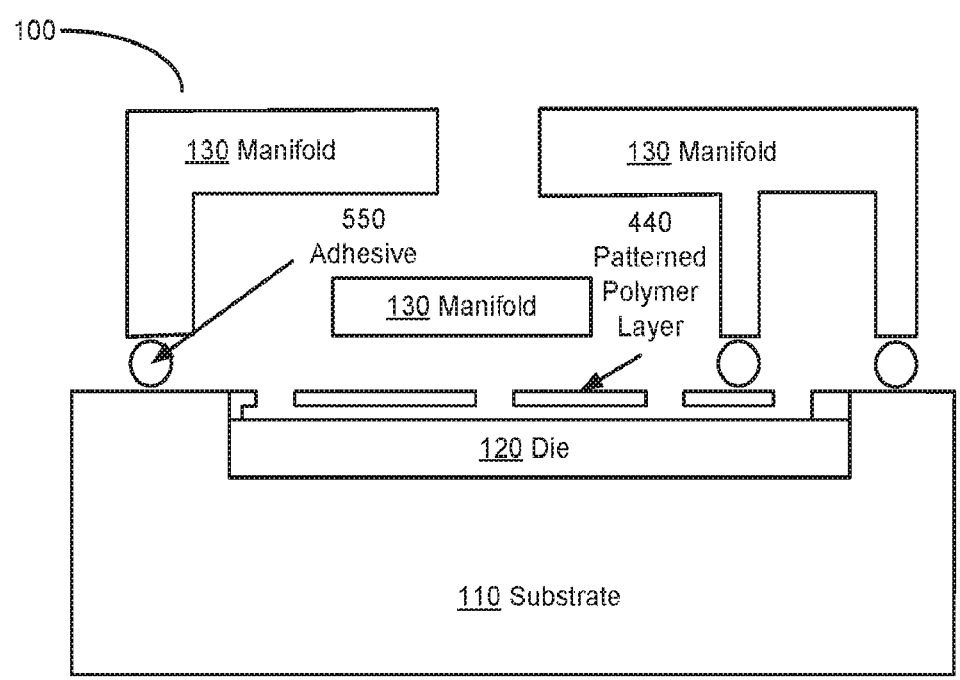
FIG. 6 is a cross-sectional diagram of a device, consistent with the disclosed implementations.

FIG. 6 is a cross-sectional diagram, consistent with the disclosed implementations. The diagram shows a die (120) surrounded by a substrate (110). Adhesive (550) has been applied between the manifold (130) and the substrate (110). Adhesive (550) has been applied between the manifold (130) and the die (120). Adhesive (550) has not been applied between other portions of the manifold (130) and the die (120). In some cases, adhesive (550) may not be applied between some portions of the manifold (130) and the substrate (110).

The adhesive (550) may be a one-part adhesive. The adhesive (550) may be a two-part adhesive. The adhesive may be applied to the manifold (130). The adhesive (550) may be applied to the die (120). The adhesive (550) maybe applied to the substrate (110). The adhesive (550) may be a pressure sensitive adhesive. The adhesive (550) may be a curable with ultraviolet light. The adhesive (550) may be thermally cured. The adhesive (550) may cure at room temperature.

In one example, the adhesive (550) is applied as a solid and then bonded to the adjacent surfaces. For example, the adhesive may be an epoxy preform. The adhesive (550) may be applied as a liquid, a paste, a slurry, an emulsion, a gel, a suspension, and/or a fluid.

In one example, the adhesive (550) is patterned on a surface of the die (120), substrate (110), and/or manifold (130). The surfaces of the manifold (130) and the die (120) and substrate (110) are aligned and then contacted. The adhesive may be used to form walls or other portions of channels or similar fluid handling components.

Figure 7:
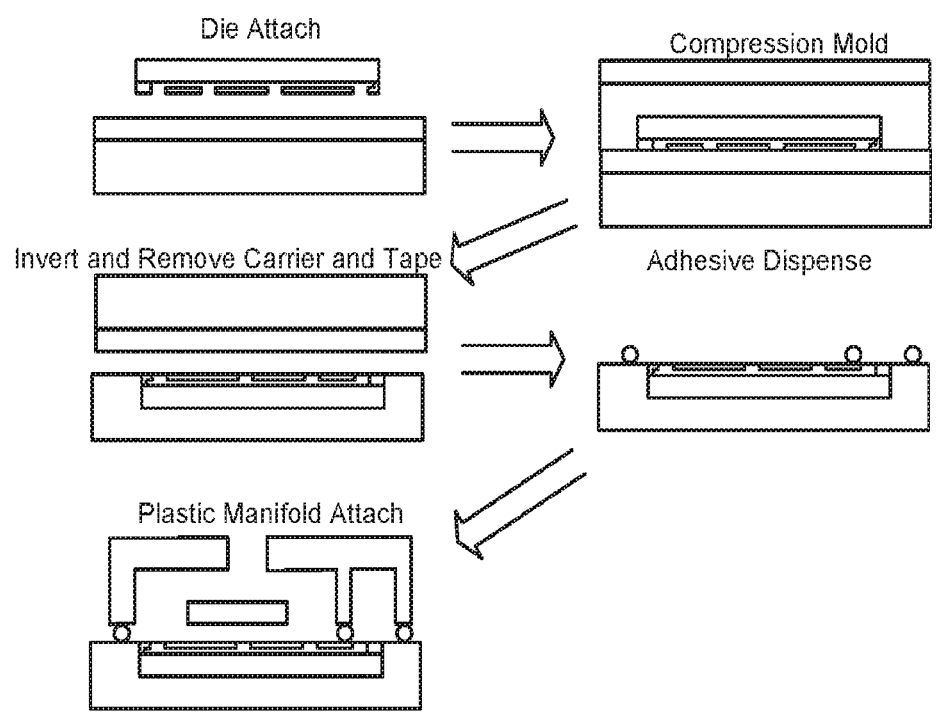
FIG. 7 is a process flow, consistent with the disclosed implementations.

FIG. 7 is a process flow, consistent with the disclosed implementations. The process flow shows an example of how the described principles can be implemented.

The first image in the upper left corner shows the die (120) attach operation. A die (120) is placed on a temporary bonding tape. The tape is on a carrier. The carrier may provide stiffness. The carrier may facilitate handling and/or molding. The tape may be double sided. The tape may be shaped to provide the desired final shape of the device (100).

The second image in the upper right corner shows the compression molding of the substrate (110) over the die (120). The tape prevents the substrate (110) from infiltrating the features of the die (120). The compression molding may be a casting operation. The compression molding may be an injection molding operation. Molding the substrate (110) around the die (120) provides a smooth, gap-free interface between the die (120) and the substrate (110). The tape may help to make the interface between the substrate (110) and the die (120) smooth and level.

The middle left image shows the removal of the carrier and temporary bonding tape. The temporary bonding tape loses its adhesion strength and/or tackiness with either high temperature bake process or UV irradiation. The substrate (110) and die (120) have been inverted and now face upward The middle right image shows the dispensing of adhesive (550) onto the substrate (110) and die (120). In one example, the adhesive (550) is dispensed as small droplets and/or dots. The adhesive is applied to portions of the substrate (110) and die (120) and not applied to other portions of the substrate (110) and (120).

The bottom left image shows the attachment of the manifold (130) to the substrate (110) and die (120). The adhesive secures the manifold (130) to the die (120) and substrate (110).

Figure 8A:
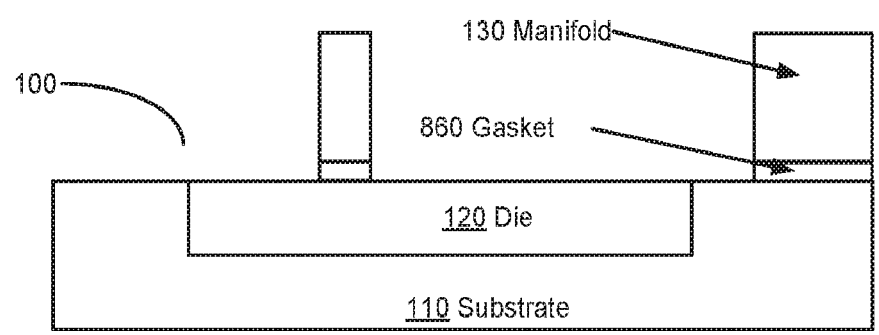
FIGS. 8A and 8B are a cross-sectional diagram and a top view of a device, consistent with the disclosed implementations.
Figure 8B:
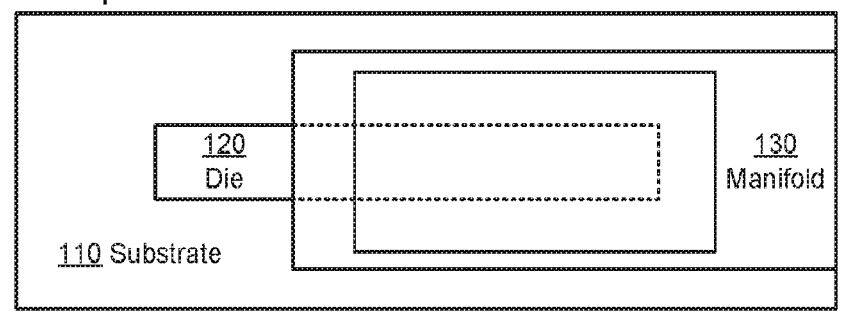

FIGS. 8A and 8B are a cross-sectional diagram and a top view of a device (100), consistent with the disclosed implementations. The device (100) includes a substrate (110) surrounding a die (120). A manifold (130) is connected with the substrate (110) and die (120) by a gasket (860).

The gasket (860) may be a compressible layer that connects the manifold (130) to the substrate (110) and die (120). The gasket (860) may include an adhesive (550). The gasket (860) may be removable from the substrate (110) and/or die (120).

Figure 9A:
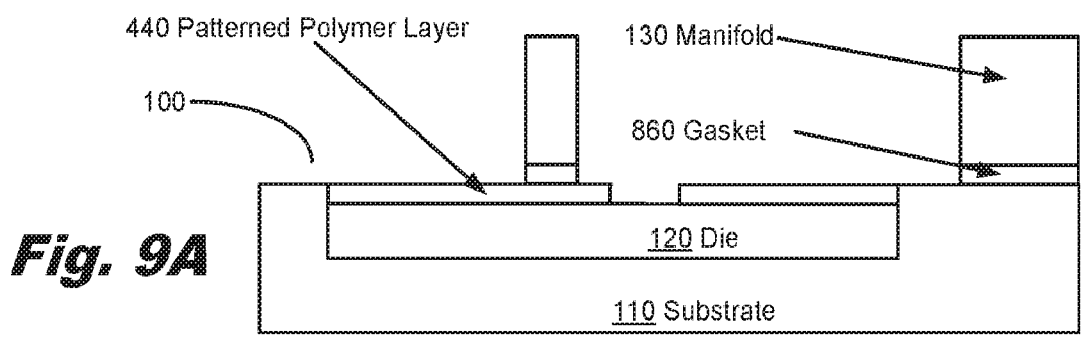
FIGS. 9A and 9B are a cross-sectional diagram and a top view of a device, consistent with the disclosed implementations.
Figure 9B:
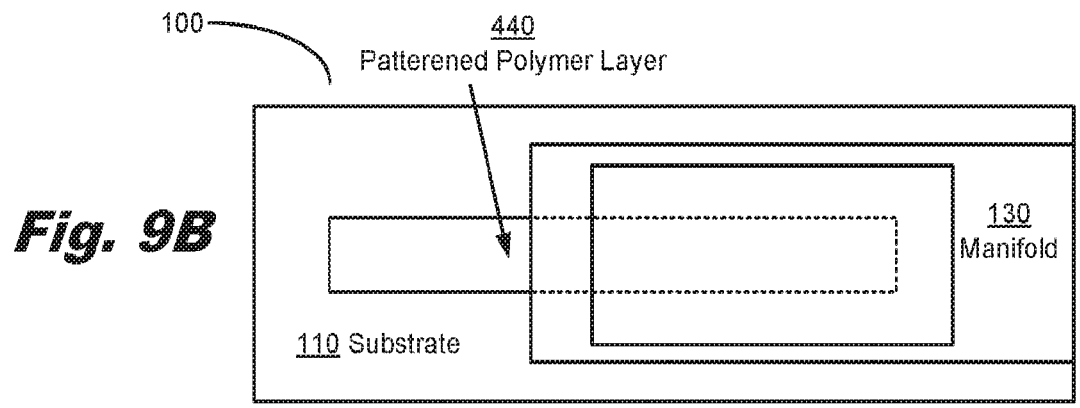

FIGS. 9A and 9B are a cross-sectional diagram and a top view of a device (100), consistent with the disclosed implementations. The device (100) includes a substrate (110) surrounding a die (120). A pattered polymer layer (440) covers a portion of the die (120). A manifold (130) is connected with the substrate (110) and pattered polymer layer (440) by a gasket (860).

The preceding description has been presented to illustrate and describe examples of the principles described. This description is not intended to be exhaustive or to limit these principles to any precise form disclosed. Many modifications and variations are possible in light of the above teaching.

What is claimed is:

1. A device comprising:
   a die comprising a microfluidic device, the microfluidic device comprising a microelectromechanical system or electronic components in addition to fluid handling components;
   a polymer substrate formed around the die, wherein the substrate surrounds, abuts and supports the die, the substrate being in direct physical contact with a bottom and sides of the die with only an upper surface of the die being exposed and not covered by the substrate, the exposed upper surface of the die being aligned with a surrounding surface of the polymer substrate; and
   a separate fluid manifold attached to the surface of the polymer substrate, the manifold extending above the surface of the polymer substrate on a same side of the substrate as the die, the manifold extending laterally over some portion of the exposed upper surface of the die, the manifold comprising a fluid inlet port and a fluid pathway from the fluid inlet port to a fluid intake of the die to deliver fluid to the die.

2. The device of claim 1, wherein the die comprises micron-scale fluid passageways formed over thin film circuitry, the fluid passageways to communicate fluid from the manifold to components of the microfluidic device.

3. The device of claim 1, wherein the polymer substrate is formed around the die with no gap between the substrate and any side of the die except for the exposed upper surface.

4. The device of claim 1, wherein the exposed upper surface of the die is coplanar with the surrounding surface of the substrate.

5. The device of claim 1, wherein the manifold is formed of molded plastic.

6. The device of claim 1, wherein fluid inlet port of the manifold comprises a tube formed of a metal, plastic, or ceramic.

7. The device of claim 1, further comprising a microfluidic routing layer of lithographically patterned material between the die and the manifold to route fluid from the manifold to corresponding portions of the microfluidic device in the die.

8. The device of claim 1, wherein at least a portion of the manifold is attached to the substrate away from the die such that the fluid pathway through the manifold to the die includes a portion of a top surface of the substrate as part of a fluidic interface between the manifold and die.

9. A method of forming a device, the device comprising:
a semiconductor die comprising a microfluidic device, the microfluidic device comprising a microelectromechanical system or electronic components in addition to fluid handling components;
a polymer substrate formed around the die, wherein the substrate surrounds, abuts and supports the die, the substrate being in direct physical contact with a bottom and sides of the die with only an upper surface of the die being exposed and not covered by the substrate, the exposed upper surface of the die being aligned with a surrounding surface of the polymer substrate; and
a separate fluid manifold attached to the surface of the polymer substrate, the manifold extending above the surface of the polymer substrate on a same side of the substrate as the die, the manifold extending laterally over some portion of the exposed upper surface of the die, the manifold comprising a fluid inlet port and a fluid pathway from the fluid inlet port to a fluid intake of the die to deliver fluid to the die
the method comprising:
forming the microfluidic device in the semiconductor die, the microfluidic device comprising the microelectromechanical system or electronic components in addition to fluid handling;
forming the polymer substrate around the die, wherein the substrate surrounds, abuts and supports the die with only an upper surface of the die being exposed, the exposed upper surface of the die being aligned with the surrounding surface of the polymer substrate; and
attaching the separate fluid manifold to the substrate over the die, the manifold providing channels for conducting fluid to the microfluidic device of the die, the manifold extending over some portion of the exposed upper surface of the die, the manifold comprising the fluid inlet port and the fluid pathway from the fluid inlet port to the fluid intake of the die to deliver fluid to the die.

10. The method of claim 9, wherein the polymer substrate surrounds the die with no gap.

11. The method of claim 9, wherein a top surface of the polymer substrate is coplanar with a top surface of the die.

12. The method of claim 9, further comprising injection molding plastic to form the manifold.

13. The method of claim 9, further comprising:
placing the semiconductor die on a release tape supported on a carrier;
molding the substrate around the die;
removing the carrier and release tape before attaching the manifold to the substrate.

14. The method of claim 9, further comprising forming:
micron-scale fluid passageways in the die; and
aligning the micron-scale fluid passageways of the die with millimeter-scale fluid channels of the manifold.

15. A device comprising:
a die comprising a microfluidic device;
a polymer substrate formed around the die, wherein the substrate surrounds, abuts and supports the die with only an upper surface of the die being exposed, the exposed upper surface of the die being aligned with a surrounding surface of the polymer substrate, the polymer substrate surrounding the die without any gap between the substrate and the die except for exposure of the upper surface of the die, wherein the upper surface of the die is coplanar with the surrounding surface of the polymer substrate; and
a separate fluid manifold, formed of plastic, metal or ceramic and attached, at one point, to the surface of the polymer substrate and attached at another point directly above the upper surface of the die so that the manifold straddles a transition between the upper surface of the die and the surface of the polymer substrate, the manifold comprising fluid channels to deliver fluid from a fluid input port of the manifold to a fluid intake of the microfluidic device of the die
wherein the die comprises fluid pathways on a micron-scale and the manifold comprises fluid pathways on a millimeter-scale.

16. The device of claim 1, wherein the separate fluid manifold is attached by an adhesive to the substrate.

17. The device of claim 1, wherein the die comprises fluid pathways on a micron-scale and the manifold comprises fluid pathways on a millimeter-scale.

18. The device of claim 1, wherein the manifold comprises alignment features to facilitate alignment of the manifold with an attachment position of the manifold on the substrate.

19. The device of claim 1, further comprising a compressible gasket between the manifold and the substrate, wherein the manifold is attached to the substrate and die through the gasket.

20. The device of claim 1, wherein the upper surface of the die comprises a patterned polymer layer coplanar with the surface of the substrate.

* * * * *